United States Patent
Shim et al.

(10) Patent No.: US 10,600,849 B2
(45) Date of Patent: Mar. 24, 2020

(54) DISPLAY DEVICE HAVING A REFLECTING AREA

(71) Applicant: LG DISPLAY CO., LTD., Seoul (KR)

(72) Inventors: Sung-Bin Shim, Yangsan-si (KR); ChooJin Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/821,443

(22) Filed: Nov. 22, 2017

(65) Prior Publication Data

US 2018/0151640 A1    May 31, 2018

(30) Foreign Application Priority Data

Nov. 29, 2016  (KR) ........................ 10-2016-0160043

(51) Int. Cl.
*H01L 29/18* (2006.01)
*H01L 33/00* (2010.01)
(Continued)

(52) U.S. Cl.
CPC .......... *H01L 27/3232* (2013.01); *G02F 1/137* (2013.01); *G02F 1/133553* (2013.01); *G09F 9/33* (2013.01); *G09F 9/35* (2013.01); *H01L 27/326* (2013.01); *H01L 51/5271* (2013.01); *H01L 51/5284* (2013.01); *G02F 1/1362* (2013.01); *G02F 1/167* (2013.01); *G02F 1/1676* (2019.01); *G02F 2001/1678* (2013.01); *G02F 2201/12* (2013.01); *G02F 2201/52* (2013.01); *G02F 2203/02* (2013.01); *H01L 27/322* (2013.01); *H01L 27/3213* (2013.01); *H01L 27/3244* (2013.01)

(58) Field of Classification Search
CPC ............. H01L 27/3232; H01L 51/5284; H01L 27/3213; H01L 27/322; H01L 27/3244; G02F 1/137; G02F 1/167; G02F 1/133553; G02F 2201/12; G02F 2203/02
See application file for complete search history.

(56) References Cited

U.S. PATENT DOCUMENTS

| 9,349,757 | B2 * | 5/2016 | Kimura | ................. | H01L 29/786 |
| 2004/0094422 | A1 * | 5/2004 | Pullen | .............. | G01N 27/44747 |
| | | | | | 204/600 |

(Continued)

FOREIGN PATENT DOCUMENTS

CN           102054936 A       5/2011

*Primary Examiner* — Ismail A Muse
(74) *Attorney, Agent, or Firm* — Birch, Stewart, Kolasch & Birch, LLP

(57) ABSTRACT

A display device is provided. The display device includes a changeable reflective structure having a first changeable electrode, a changeable reflecting layer and a second changeable electrode, which are sequentially stacked on an upper substrate opposite a lower substrate. In the display device, the reflectance of the changeable reflecting layer may be adjusted by controlling a voltage applied to the first changeable electrode and the second changeable electrode according to a state of a light-emitting structure which is disposed on an emitting area of the lower substrate. Thus, in the display device, a decrease of the color sense by the reflection of external light in a display state may be prevented, and the reflective area may have sufficient reflectance for serving as a mirror in a non-display state.

16 Claims, 11 Drawing Sheets

(51) Int. Cl.
  H01L 27/32 (2006.01)
  G09F 9/33 (2006.01)
  G09F 9/35 (2006.01)
  H01L 51/52 (2006.01)
  G02F 1/1335 (2006.01)
  G02F 1/137 (2006.01)
  G02F 1/1362 (2006.01)
  G02F 1/1675 (2019.01)
  G02F 1/1676 (2019.01)
  G02F 1/167 (2019.01)

(56) References Cited

U.S. PATENT DOCUMENTS

| | | | |
|---|---|---|---|
| 2010/0039354 A1* | 2/2010 | Sakamoto | G02F 1/167 345/55 |
| 2010/0097685 A1* | 4/2010 | Kawase | G02F 1/167 359/290 |
| 2010/0164848 A1* | 7/2010 | Manabe | C09K 19/544 345/87 |
| 2011/0085635 A1* | 4/2011 | Koyama | G09G 3/3266 377/78 |
| 2011/0235162 A1* | 9/2011 | Yamazaki | G02F 1/167 359/296 |
| 2012/0001170 A1* | 1/2012 | Yamazaki | H01L 27/1225 257/43 |
| 2014/0028660 A1* | 1/2014 | Fujimori | G09G 3/344 345/214 |
| 2015/0014650 A1 | 1/2015 | Lim et al. | |
| 2015/0054816 A1* | 2/2015 | Yamada | G09G 3/344 345/212 |
| 2015/0370144 A1 | 12/2015 | Yamazaki et al. | |
| 2016/0372054 A1* | 12/2016 | Yamazaki | G09G 3/344 |
| 2018/0061866 A1* | 3/2018 | Koyama | G09G 3/3266 |
| 2018/0067373 A1* | 3/2018 | Kimura | G02F 1/167 |

* cited by examiner

DISPLAY DEVICE HAVING A REFLECTING AREA

CROSS-REFERENCE TO RELATED APPLICATION

This application claims the priority benefit of Korean Patent Application No. 10-2016-0160043, filed on Nov. 29, 2016, which is hereby incorporated by reference in its entirety.

BACKGROUND OF THE INVENTION

Field of the Invention

Embodiments of the present invention relate to a display device serving as mirror by a reflecting area in a non-display state.

Discussion of the Related Art

Generally, an electronic appliance, such as a monitor, a TV, a laptop computer, and a digital camera, include a display device to realize an image. For example, the display device may include a liquid crystal display device and an organic light-emitting display device.

The display device may include emitting areas displaying a specific color to realize the image. The display device may further include a non-emitting area between the emitting areas. The display device may serve as a mirror in the non-display state in which the image is not realized. For example, the non-emitting area of the display device may be a reflecting area in which the external light is reflected in the non-display state.

However, since the reflection of the external light by the reflecting area continues even in the display state in which the image is realized, the display device has a problem that the color sense is degraded due to the external light reflected from the reflecting area. Also, when the reflectance of the reflecting area is lowered in order to prevent degrading the color sense due to the reflected external light, the display device may not properly perform the mirror function by the reflecting area in the non-display state.

SUMMARY OF THE INVENTION

Accordingly, the embodiments of the present invention are directed to a display device having a reflecting area that substantially obviates one or more problems due to limitations and disadvantages of the related art.

An object of the present invention is to provide a display device capable of preventing the degradation of the color sense due to the external light reflected from a reflecting area.

Another object of the present invention is to provide a display device in which the reflecting area can have sufficient reflectance to serve as a mirror in the non-display state.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a display device including a lower substrate and an upper substrate opposite the lower substrate. The lower substrate includes an emitting area and a reflecting area. A light-emitting structure is disposed on the emitting area of the lower substrate. A changeable reflective structure overlapping with the reflecting area of the lower substrate is disposed on the upper substrate. The changeable reflective structure includes a first changeable electrode, a reflecting layer and a second changeable electrode, which are sequentially stacked on the upper substrate.

The reflecting layer may include micro-capsules filled by a first material having a first polarity and a second material having a second polarity different from the first polarity. The second material may have a reflectance higher than that of the first material.

The first material may be darker than the second material. The first material may include carbon black.

The second material may include a metal, such as aluminum (Al) or silver (Ag).

An upper insulating pattern overlapping with the emitting area of the lower substrate may be disposed on the upper substrate. A side surface of the upper insulating pattern may be in direct contact with the changeable reflective structure.

The upper insulating pattern may include a transparent material.

A color filter overlapping with the light-emitting structure may be disposed on the upper substrate. The upper insulating pattern may be disposed between the upper substrate and the color filter.

The color filter may include an end portion overlapping with the changeable reflective structure.

To accomplish the other object of the present invention, a display device includes a lower substrate and an upper substrate opposite the lower substrate, a lower light-emitting electrode on the lower substrate. An edge of the lower light-emitting electrode is covered by a bank insulating layer. A light-emitting layer is disposed on a surface of the lower light-emitting electrode exposed by the bank insulating layer. An upper light-emitting electrode is disposed on the light-emitting layer. A changeable reflecting layer overlapping with the bank insulating layer is disposed on the upper substrate.

An upper insulating pattern contacting a side surface of the changeable reflecting layer may be disposed on the upper substrate. A thickness of the upper insulating pattern may be the same as a thickness of the changeable reflecting layer.

A reflective pattern may be disposed between the bank insulating layer and the changeable reflecting layer.

The changeable reflecting layer may include an electrophoresis device (EPD).

A first changeable electrode may be disposed between the upper substrate and the changeable reflecting layer. A second changeable electrode may be disposed between the changeable reflecting layer and the reflective pattern. The second changeable electrode may overlap an edge of the changeable reflecting layer.

The reflective pattern may be in direct contact with a portion of the changeable reflecting layer exposed by the second changeable electrode.

To accomplish the other object of the present invention, a display device includes a lower substrate including an emitting area and a reflecting area; an upper substrate opposite the lower substrate; a light-emitting structure on the emitting area of the lower substrate; and a changeable reflective structure disposed between the upper and lower substrates, and overlapping the reflecting area.

A reflectance from the reflecting area may be changed according to a state of the changeable reflective structure.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE EMBODIMENTS

Figure 1:
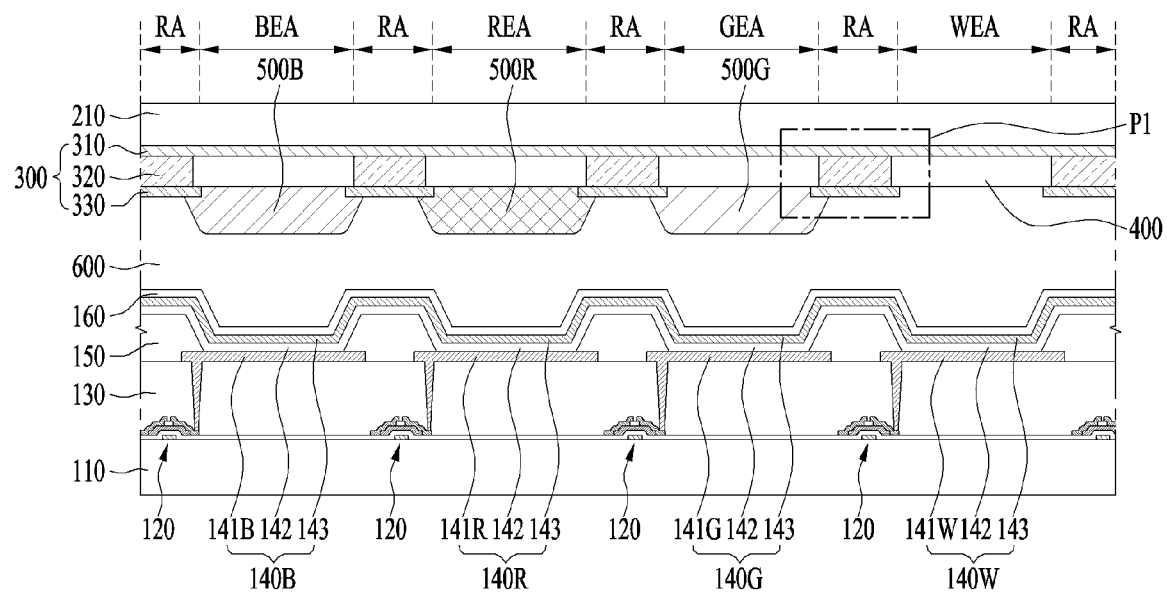
FIG. 1 is a view schematically showing a display device according to an embodiment of the present invention.

Hereinafter, details related to the above objects, technical configurations, and operational effects of the embodiments of the present invention will be clearly understood by the following detailed description with reference to the drawings, which illustrate example embodiments of the present invention. Here, the embodiments of the present invention are provided in order to allow the technical sprit of the present invention to be satisfactorily provided to those skilled in the art, and thus the present invention may be embodied in other forms and is not limited to the embodiments described below.

In addition, the same or similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing from the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

FIG. 1 is a view schematically showing a display device according to an embodiment of the present invention.

Referring to FIG. 1, the display device according to the embodiment of the present invention may comprise a lower substrate 110, thin film transistors 120, light-emitting structures 140B, 140R, 140G and 140W, an upper substrate 210, changeable reflective structures 300 and an upper insulating pattern 400.

The lower substrate 110 may support the thin film transistors 120 and the light-emitting structures 140B, 140R, 140G and 140W. The lower substrate 110 may include an insulating material. For example, the lower substrate 110 may include glass or plastic.

The lower substrate 110 may include emitting areas BEA, REA, GEA and WEA and a reflecting area RA. The lower substrate 110 may include the emitting areas BEA, REA, GEA and WEA displaying various colors. For example, the lower substrate 110 may include a blue emitting area BEA displaying blue color, a red emitting area REA displaying red color, a green emitting area GEA displaying green color and a white emitting area WEA displaying white color. The reflecting area RA may be disposed between the emitting areas BEA, REA, GEA and WEA. Each of the emitting areas BEA, REA, GEA and WEA may be separated from the adjacent emitting areas BEA, REA, GEA and WEA by the reflecting area RA.

The thin film transistors 120 may be disposed on the lower substrate 110. Each of the thin film transistors 120 may include a gate electrode, a gate insulating layer, a semiconductor pattern, a source electrode and a drain electrode. The gate insulating layer may be disposed between the gate electrode and the semiconductor pattern. The source electrode and the drain electrode may be electrically connected to an opposite end portion of the semiconductor pattern, respectively. Each of the thin film transistors 120 may further include an etch stopper covering a surface of the semiconductor pattern between the source electrode and the drain electrode.

The display device according to the embodiment of the present invention is described that the semiconductor pattern of each thin film transistor 120 may be disposed between the gate electrode and the source/drain electrodes. However, in the display device according to another embodiment of the present invention, each of thin film transistors 120 may include a gate electrode between the semiconductor pattern and the source/drain electrode.

The display device according to the embodiment of the present invention is described that the thin film transistors 120 are in direct contact with the lower substrate 110. However, the display device according to another embodiment of the present invention may further include a buffer layer between the lower substrate 110 and the thin film transistors 120. The buffer layer may include an insulating layer. For example, the buffer layer may include silicon oxide.

The display device according to the embodiment of the present invention may further include a planarization layer 130 on the thin film transistors 120. The planarization layer 130 may remove a thickness difference due to the thin film transistors 120. The thin film transistors 120 may be completely covered by the planarization layer 130. For example, an upper surface of the planarization layer 130 facing the upper substrate 210 may be parallel with a surface of the lower substrate 110. The planarization layer 130 may include an insulating material. For example, the planarization layer 130 may include an organic insulating material.

The display device according to the embodiment of the present invention is described that the thin film transistors 120 is in direct contact with the planarization layer 130. However, the display device according to another embodiment of the present invention may further include a lower passivation layer between the thin film transistors 120 and the planarization layer 130. The lower passivation layer may include an insulating material. The lower passivation layer may include a material different from the planarization layer 130. For example, the lower passivation layer may include silicon oxide and/or silicon nitride. The lower passivation layer may have a multi-layer structure.

The light-emitting structures 140B, 140R, 140G and 140W may display a specific color. The light-emitting structures 140B, 140R, 140G and 140W may overlap the emitting areas BEA, REA, GEA and WEA of the lower substrate 110. For example, the light-emitting structures 140B, 140R, 140G and 140W may include a blue light-emitting structure 140B overlapping with the blue emitting area BEA of the lower substrate 110, a red light-emitting structure 140R overlapping with the red emitting area REA of the lower substrate 110, a green light-emitting structure 140G overlapping with the green emitting area GEA of the lower substrate 110, and a white light-emitting structure 140W overlapping with the white emitting area WEA of the lower substrate 110.

Each of the light-emitting structures 140B, 140R, 140G and 140W may include a lower light-emitting electrode 141B, 141R, 141G and 141W, a light-emitting layer 142 and an upper light-emitting electrode 143, which are sequentially stacked on the lower substrate 110.

The light-emitting structures 140B, 140R, 140G and 140W may be controlled by the thin film transistor 120 related to the corresponding emitting area BEA, REA, GEA and WEA. For example, the lower light-emitting electrode 141B, 141R, 141G and 141W of each light-emitting structure 140B, 140R, 140G and 140W may be electrically connected to the corresponding thin film transistor 120. The light-emitting structures 140B, 140R, 140G and 140W may be disposed on the planarization layer 130. For example, the planarization layer 130 may include contact holes exposing a portion of each thin film transistor 120.

The lower light-emitting electrode 141B, 141R, 141G and 141W may include a conductive material. The lower light-emitting electrode 141B, 141R, 141G and 141W may include a material having high reflectance. For example, the lower light-emitting electrode 141B, 141R, 141G and 141W may include a metal, such as aluminum (Al) and argentum (i.e., silver—Ag). The lower light-emitting electrode 141B, 141R, 141G and 141W may have a multi-layer structure. For example, the lower light-emitting electrode 141B, 141R, 141G and 141W may have a structure in which a reflective electrode including a metal having high reflectance is disposed between transparent electrodes including a transparent conductive material such as ITO and IZO.

The lower light-emitting electrode 141B, 141R, 141G and 141W of each light-emitting structure 140B, 140R, 140G and 140W may be electrically insulated from the lower light-emitting electrode 141B, 141R, 141G and 141W of the adjacent light-emitting structure 140B, 140R, 140G and 140W. For example, the red lower light-emitting electrode 141R of the red light-emitting structure 140R between the blue light-emitting structure 140B and the green light-emitting structure 140G may be spaced apart from the blue lower light-emitting electrode 141B of the blue light-emitting structure 140B and the green lower light-emitting electrode 141G of the green light-emitting structure 140G.

The display device according to the embodiment of the present invention may further include a bank insulating layer 150 between the adjacent lower light-emitting electrodes 141B, 141R, 141G and 141W. The bank insulating layer 150 may fill a space between the adjacent lower light-emitting electrodes 141B, 141R, 141G and 141W. For example, the bank insulating layer 150 may cover an edge of each lower light-emitting electrode 141B, 141R, 141G and 141W. The bank insulating layer 150 may include an insulating material. For example, the bank insulating layer 150 may include an organic insulating material, such as benzocyclobutene (BCB), poly-imide and photo-acryl. The planarization layer 130 may include a material different from the bank insulating layer 150.

The light-emitting layer 142 may be disposed on the lower light-emitting electrode 141B, 141R, 141G and 141W exposed by the bank insulating layer 150. For example, the light-emitting layer 142 may be in direct contact with a surface of the lower light-emitting electrode 141B, 141R, 141G and 141W exposed by the bank insulating layer 150 on the corresponding emitting area BEA, REA, GEA and WEA.

The light-emitting layer 142 may generate light having luminance corresponding to a voltage difference between the lower light-emitting electrode 141B, 141R, 141G and 141W and the upper light-emitting electrode 143 of the corresponding light-emitting structure 140B, 140R, 140G and 140W. For example, the light-emitting layer 142 may include an emitting material layer (EML) having an emission material. The emission material may include an organic material, an inorganic material or a hybrid material. For example, the display device according to the embodiment of the present invention may be an organic light-emitting display device having an organic light-emitting layer.

The light-emitting layer 142 may have a multi-layer structure in order to increase luminous efficacy. For example, the light-emitting layer 142 may further include a hole injection layer (HIL), a hole transport layer (HTL), an electron transport layer (ETL), and an electron injection layer (EIL).

The upper light-emitting layer 143 may be disposed on the light-emitting layer 142. The upper light-emitting layer 143 may include a conductive material. The upper light-emitting layer 143 may have a structure different from the lower light-emitting layer 141B, 141R, 141G and 141W. For example, the upper light-emitting layer 143 may be a transparent electrode.

The display device according to the embodiment of the present invention may further include an upper passivation layer 160 on the light-emitting structures 140B, 140R, 140G and 140W. The upper passivation layer 160 may protect the light-emitting structures 140B, 140R, 140G and 140W from the external moisture permeation and the external impact. The upper passivation layer 160 may be extended onto the bank insulating layer 150. The upper passivation layer 160 may include an insulating material. The upper passivation layer 160 may have a multi-layer structure. For example, the upper passivation layer 160 may have a structure in which an organic layer including an organic material is disposed between inorganic layers including an inorganic material.

The upper substrate 210 may be opposite to the lower substrate 110. For example, the upper substrate 210 may be disposed on the light-emitting structures 140B, 140R, 140G and 140W. The upper substrate 210 may include an insulating material. The upper substrate 210 may include a transparent material. For example, the upper substrate 210 may include glass or plastic.

The upper substrate 210 may include the emitting areas BEA, REA, GEA and WEA and the reflecting area RA. The reflecting area RA of the upper substrate 210 may overlap the reflecting area RA of the lower substrate 110. For example, the emitting areas BEA, REA, GEA and WEA of the upper substrate 210 may be separated by the reflecting area RA of the upper substrate 210. The emitting areas BEA, REA, GEA and WEA of the upper substrate 210 may overlap the emitting areas BEA, REA, GEA and WEA of the lower substrate 110. For example, the upper substrate 210 may include the blue emitting area BEA, the red emitting area REA, the green emitting area GEA and the white emitting area WEA.

The changeable reflective structures 300 may be disposed on the upper substrate 210. For example, the changeable reflective structures 300 may be disposed on a lower surface of the upper substrate 210 facing the lower substrate 110. The changeable reflective structures 300 may be disposed on the reflecting area RA of the upper substrate 210. The changeable reflective structures 300 may overlap the reflecting area RA of the lower substrate 110. The changeable reflective structures 300 may overlap the bank insulating layer 150. In embodiments of the present invention, the changeable reflective structures 300 or components may exactly overlap the reflecting area RA of the upper substrate 210 or the reflecting area RA of the lower substrate 110, but such is not required, and a dimension of the changeable reflective structures 300 or its components may differ from that of reflecting areas RAs.

The changeable reflective structures 300 may respectively include a first changeable electrode 310, a reflecting layer 320 and a second changeable electrode 330, which are sequentially stacked on the upper substrate 210.

The first changeable electrode 310 may be disposed close to the upper substrate 210. For example, the first changeable electrode 310 may be in direct contact with the lower surface of the upper substrate 210. The first changeable electrode 310 may include a conductive material. The first changeable electrode 310 may include a transparent material. For example, the first changeable electrode 310 may include ITO or IZO.

The second changeable electrode 330 may be disposed on the first changeable electrode 310. The second changeable electrode 330 may include a conductive material. The second changeable electrode 330 may include a material different from the first changeable electrode 310. For example, the second changeable electrode 330 may include a metal having high reflectance, such as aluminum (Al) and silver (Ag). Thus, in the display device according to the embodiment of the present invention, the light-leakage may be prevented or reduced.

The changeable reflecting layer 320 may be disposed between the first changeable electrode 310 and the second changeable electrode 320. The changeable reflecting layer 320 may have different reflectance depending on a voltage applied to the first changeable electrode 310 and the second changeable electrode 330. For example, the reflectance of the changeable reflecting layer 320 may be changed by a state of the light-emitting structures 140B, 140R, 140G and 140W. In embodiments of the present invention, the changeable reflective structures 300 may be exactly aligned with the reflecting area RA of the upper substrate 210 or the reflecting area RA of the lower substrate 110, or may be directly above or below the reflecting area RA of the upper substrate 210 or the reflecting area RA of the lower substrate 110, but such is not required, the changeable reflective structures 300 may be positioned offset from that of reflecting areas RAs. In embodiments of the present invention, the dimensions of the first changeable electrode 310, the changeable reflecting layer 320, and the second changeable electrode 330 may be the same or different relative to each other. For example, a width of the changeable reflecting layer 320 may be different from at least one of the first changeable electrode 310 and the second changeable electrode 330. For example, the width of the changeable reflecting layer 320 may be wider or narrower than the least one of the first changeable electrode 310 and the second changeable electrode 330. In other embodiments of the invention, the width of the changeable reflecting layer 320 may be the same with at least one of the first changeable electrode 310 and the second changeable electrode 330.

Figure 2A:
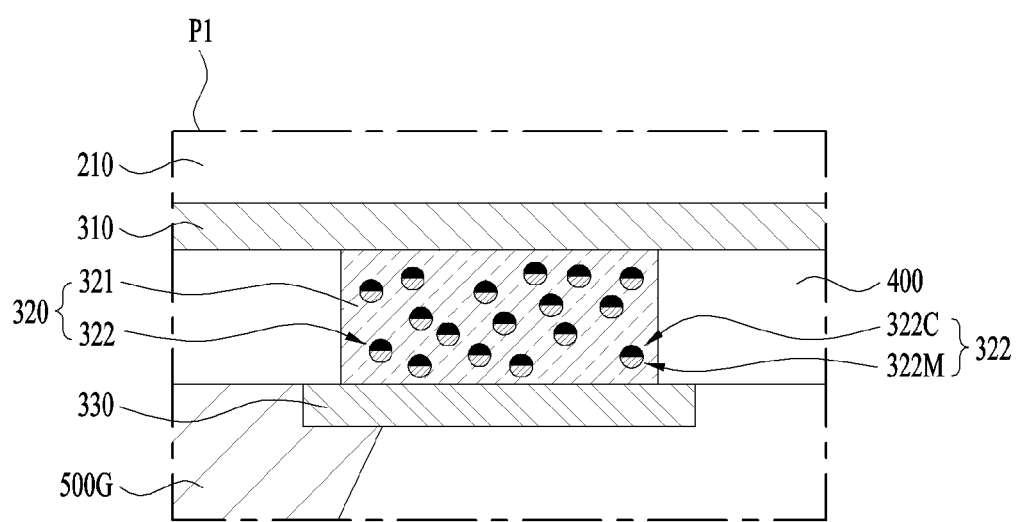
FIGS. 2A and 2B are enlarged views of region P1 in FIG. 1.
Figure 2B:
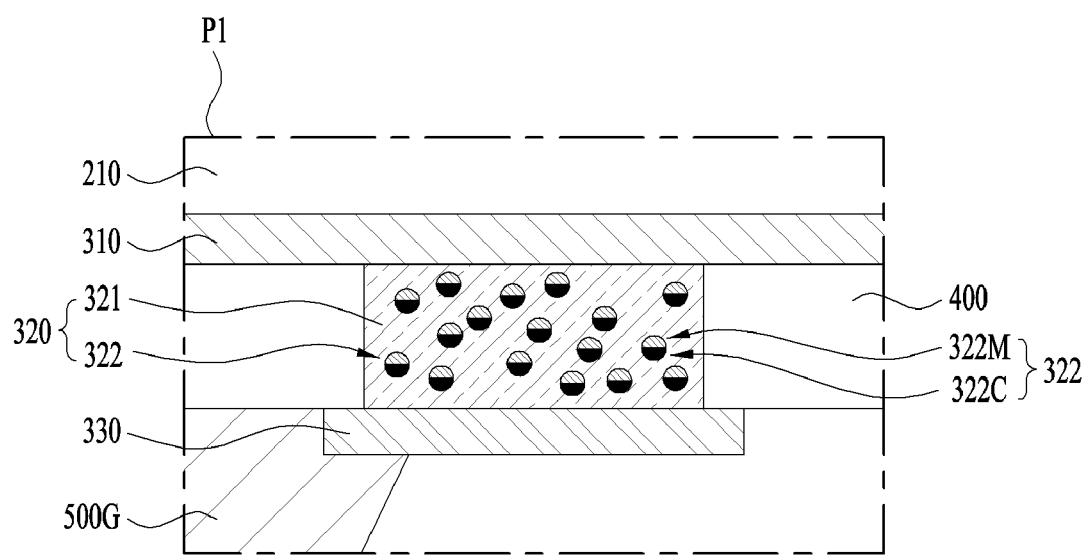

FIGS. 2A and 2B are enlarged views of region P1 in FIG. 1.

Referring to FIGS. 1, 2A and 2B, the changeable reflecting layer 320 of the display device according to the embodiment of the present invention may include a dispersion solvent 321 and micro-capsules 322 disposed within the dispersion solvent 321.

The dispersion solvent 321 may include a material capable of allowing the micro-capsules 322 to be freely moved according to the voltage applied to the first changeable electrode 310 and the second changeable electrode 330. The dispersion solvent 321 may have a non-polar property. For example, the dispersion solvent 321 may include halogenated solvents, saturated hydrocarbons, silicon oils, low molecular weight halogen-containing polymers, epoxides, vinyl ethers, vinyl ester, aromatic hydrocarbon, toluene, naphthalene, paraffinic liquids or poly chlorotrifluoroethylene polymers.

Each of the micro-capsules 322 may be filled by a first material 322C having a first polarity and a second material 322M having a second polarity different from the first polarity. The position of the first material and the position of the second material in the micro-capsules 322 may depend on the voltage applied to the first changeable electrode 310 and the second changeable electrode 320. For example, when a voltage of the second polarity is applied to the first changeable electrode 310 and a voltage of the first polarity is applied to the second changeable electrode 320, the first material 322C may move toward the first changeable electrode 310 and the second material 322M may move toward the second changeable electrode 320 within the corresponding micro-capsule 322, as shown in FIG. 2A. For example, when a voltage of the first polarity is applied to the first changeable electrode 310 and a voltage of the second polarity is applied to the second changeable electrode 320, the first material 322C may move toward the second changeable electrode 310 and the second material 322M may move toward the first changeable electrode 320 within the corresponding micro-capsule 322, as shown in FIG. 2B.

The reflectance of the second material 322M may be higher than the reflectance of the first material 322C. For example, the second material 322M may include a metal, such as aluminum (Al) and silver (Ag). Thus, the display device according to the embodiment of the present invention may adjust the location of the second material 322M within the corresponding micro-capsule 322 by controlling the voltage applied to the first changeable electrode 310 and the second changeable electrode 330, in order to change the reflectance of the changeable reflective structures 300 on the reflecting area RA of the upper substrate 210.

The reflectance of the changeable reflecting layer 320 may be changed depending on whether the image is realized by the light-emitting structures 140B, 140R, 140G and 140W. For example, in the non-display state in which the image is not realized by the light-emitting structures 140B, 140R, 140G and 140W, the display device according to the embodiment of the present invention may control the second material 322M to be disposed close to the first changeable electrode 310 within the corresponding micro-capsule 322, as shown in FIG. 2A. For example, in the display state in which the image is realized by the light-emitting structures 140B, 140R, 140G and 140W, the display device according to the embodiment of the present invention may control the first material 322C to be disposed close to the first changeable electrode 310 within the corresponding micro-capsule 322, as shown in FIG. 2B. Thus, in the display device according to the embodiment of the present invention, the reflectance of the reflecting area RA in the display state may be relatively lower than the reflectance of the reflecting area RA in the non-display state. Therefore, in the display device according to the embodiment of the present invention, the reflecting area RA in the non-display state may have sufficient reflectance to serve as a mirror, and the reflectance of the reflecting area RA in the display state may be decreased in order to prevent the degradation of the color sense.

The first material 322C may be close to black than the second material 322M. For example, the first material 322C may include carbon black. Thus, in the display device according to the embodiment of the present invention, the reflecting area RA in the display state may be blackened by the first material 322C of the changeable reflective structures 300. That is, in the display device according to the embodiment of the present invention, the reflecting area RA may serve as a black matrix in the display state. Therefore, in the display device according to the embodiment of the present invention, the quality of the image in the display state may be improved.

The upper insulating pattern 400 may be disposed on the emitting areas BEA, REA, GEA and WEA of the upper substrate 210. The upper insulating pattern 400 may overlap the emitting areas BEA, REA, GEA and WEA of the lower substrate 110. The upper insulating pattern 400 may overlap the light-emitting structures 140B, 140R, 140G and 140W.

A side surface of the upper insulating pattern 400 may be in direct contact with the changeable reflective structures 300. For example, the upper insulating pattern 400 may be disposed between the changeable reflecting layers 320 of the adjacent changeable reflective structures 300. The adjacent changeable reflecting layers 320 may be insulated by the upper insulating pattern 400. Thus, in the display device according to the embodiment of the present invention, the micro-capsules 322 of each changeable reflecting layer 320 may be prevent from being affected by the adjacent changeable reflective structures 300.

A thickness of the upper insulating pattern 400 may be the same as a thickness of the changeable reflecting layer 320. The first changeable electrode 310 may extend between the upper substrate 210 and the upper insulating pattern 400. The second changeable electrode 330 may include an end portion overlapping with an edge of the upper insulating pattern 400. The second changeable electrode 330 may completely cover a lower surface of the changeable reflecting layer 320 facing the lower substrate 110. Thus, in the display device according to the embodiment of the present invention, all of the micro-capsules 322 within the dispersion solvent 321 of the changeable reflecting layer 320 may be utilized by the first changeable electrode 310 and the second changeable electrode 330.

The upper insulating pattern 400 may include an insulating material. The upper insulating pattern 400 may include a transparent material. For example, the upper insulating pattern may include silicon oxide.

In the display device according to the embodiment of the present invention, the light-emitting structures 140B, 140R, 140G and 140W may display the same color. For example, the light-emitting layer 142 of each light-emitting structure 140B, 140R, 140G and 140W may include the same material. The light-emitting layer 142 of each light-emitting structure 140B, 140R, 140G and 140W may be connected to each other. For example, the light-emitting layer 142 may be extended onto the bank insulating layer 150. The light-emitting layer 142 may display a color that is easily converted to another color. For example, the light-emitting layer 142 may display white color. The upper light-emitting electrode 143 may be extended along the light-emitting layer 142. For example, the upper light-emitting electrode 143 of each light-emitting structure 140B, 140R, 140G and 140W may be connected to each other.

The display device according to the embodiment of the present invention may further include color filters 500B, 500R and 500G. Each of the emitting areas BEA, REA, GEA and WEA may realize the corresponding color by the color filters 500B, 500R and 500G. The color filters 500B, 500R and 500G may be not disposed on the emitting area BEA, REA, GEA and WEA realizing the same color as the light-emitting layer 142 of the light-emitting structures 140B, 140R, 140G and 140W. For example, the color filters 500B, 500R and 500G may include a blue color filter 500B overlapping with the blue emitting area BEA of the lower substrate 110, a red color filter 500R overlapping with the red emitting area REA of the lower substrate 110, and a green color filter 500G overlapping with the green emitting area GEA of the lower substrate 110.

The color filters 500B, 500R and 500G may be disposed between the light-emitting structures 140B, 140R, 140G and 140W and the upper insulating pattern 400. For example, the color filters 500B, 500R and 500G may be disposed on a lower surface of the upper insulating pattern 400 facing the lower substrate 110. The color filters 500B, 500R and 500G may be extended onto the changeable reflective structures 300. For example, each of the color filters 500B, 500R and 500G may include an end portion overlapping with an edge of the changeable reflecting layer 320. Each of the color filters 500B, 500R and 500G may completely cover the lower surface of the corresponding upper insulating pattern 400. Thus, the display device according to the embodiment of the present invention may prevent the light-leakage.

In the display device according to the embodiment of the present invention, a space between the lower substrate 110 on which the light-emitting structures 140B, 140R, 140G and 140W is disposed and the upper substrate 210 on which the changeable reflective structures 300 is disposed may be filled by a filler 600. For example, the filler 600 may be disposed between the upper passivation layer 160 and the color filters 500B, 500R and 500G. Thus, in the display device according to the embodiment of the present invention, the damage of the light-emitting structures 140B, 140R, 140G and 140W by the external impact may be prevented.

Accordingly, the display device according to the embodiment of the present invention may adjust the reflectance of the changeable reflective structures 300 on the reflecting area RA of the upper substrate 210 according to the state of the light-emitting structure 140B, 140R, 140G and 140W, so that the degradation of the color sense due to the reflected external light may be prevented or reduced in the display state, and the reflecting area RA in the non-display state may have sufficient reflectance. Thereby, in the display device according to the embodiment of the present invention, the quality of the image in the display state and the mirror function in the non-display state may be improved.

The display device according to the embodiment of the present invention is described that the changeable reflecting layer 320 of each changeable reflective structure 300 may include the micro-capsules 322 filled by the first material 322C having the first polarity and the second material 322M having the second polarity. However, in the display device according to another embodiment of the present invention, the changeable reflecting layer 320 of each changeable reflective structure 300 may include first charged particles 323 having the first polarity and second charged particles 324 having the second polarity. The first charged particles 323 and the second charged particles 324 may be dispersed in the dispersion solvent. For example, in the display device according to another embodiment of the present invention, the changeable reflecting layer 320 may include an electrophoresis device (EPD).

Figure 3A:
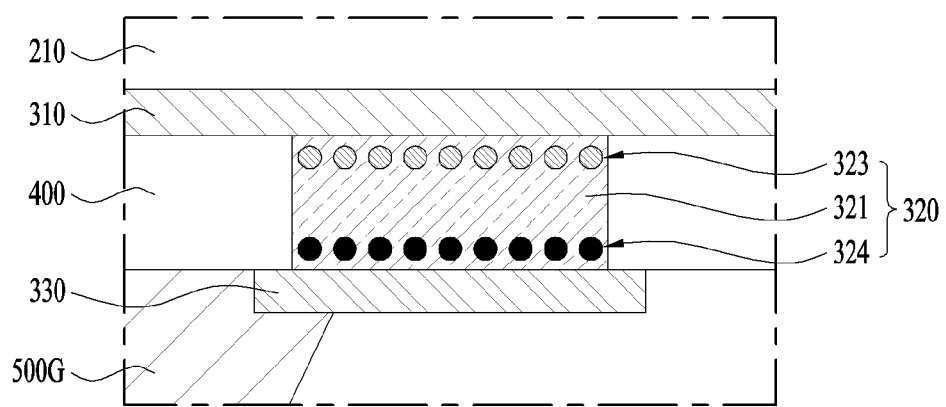
FIGS. 3A and 3B are views showing a changeable reflective structure of a display device according to another embodiment of the present invention.
Figure 3B:
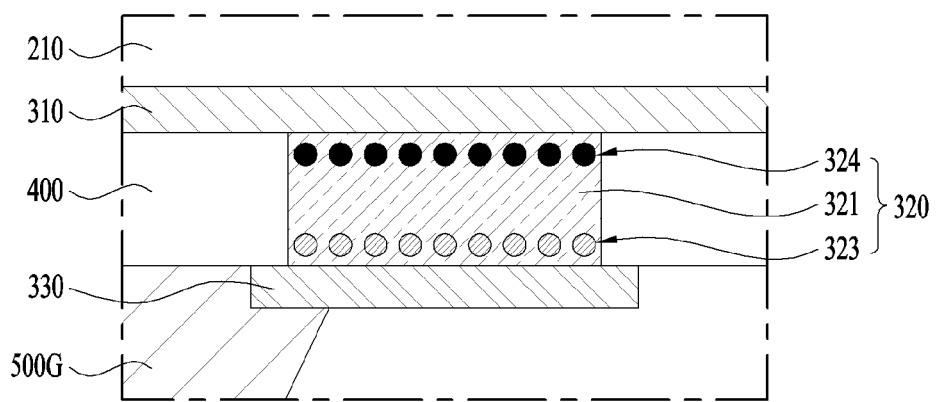

The first charged particles 323 may be a material having the reflectance relatively higher than the second charged particles 324. The second charged particles 324 may be blacker than the first charged particles 323. The display device according to another embodiment of the present invention may control a voltage applied to the first changeable electrode 310 and the second changeable electrode 330 so that the first charged particles 323 is disposed near the first changeable electrode 310 in a non-display state, as shown in FIG. 3A. Also, the display device according to another embodiment of the present invention may control a voltage applied to the first changeable electrode 310 and the second changeable electrode 330 so that the second charged particles 324 is disposed near the first changeable electrode 310 in a non-display state, as shown in FIG. 3B. Thus, in the display device according to another embodiment of the present invention, the reflectance of the reflecting area may be adjusted depending on whether the image is realized, so that the quality of the image in the display state and the mirror function in the non-display state may be improved.

The display device according to the embodiment of the present invention is described that the reflectance of the changeable reflecting layer 320 is directly changed depending on the state of the light-emitting structures 140B, 140R, 140G and 140W. However, the display device according to another embodiment of the present invention may change the reflectance of the changeable reflective structure 300 by adjusting the transmissivity of the changeable reflecting layer 320. For example, in the display device according to another embodiment of the present invention, each of the changeable reflective structure 300 may include the first changeable electrode 310, the changeable reflecting layer 320, the second changeable electrode 320 and a reflective pattern 340, which are sequentially stacked on the upper substrate 210. The second changeable electrode 330 may partially expose a lower surface of the changeable reflecting layer 320 facing the lower substrate 110. The lower surface of the changeable reflecting layer 320 exposed by the second changeable electrode 330 may be in direct contact with the reflective pattern 340.

Figure 4:
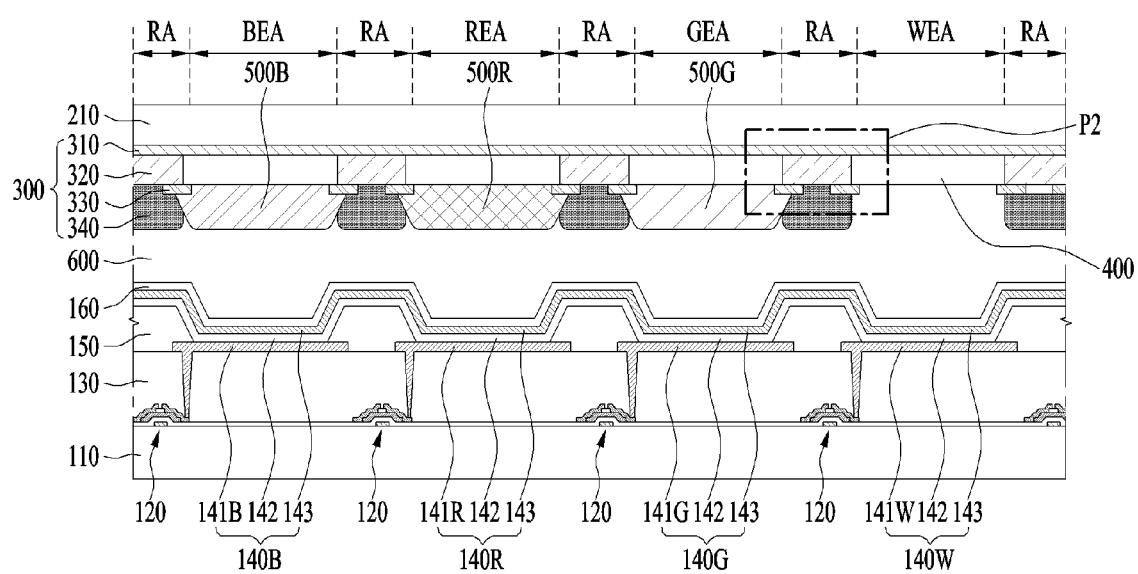
FIG. 4 is views showing a display device according to another embodiment of the present invention.
Figure 5A:
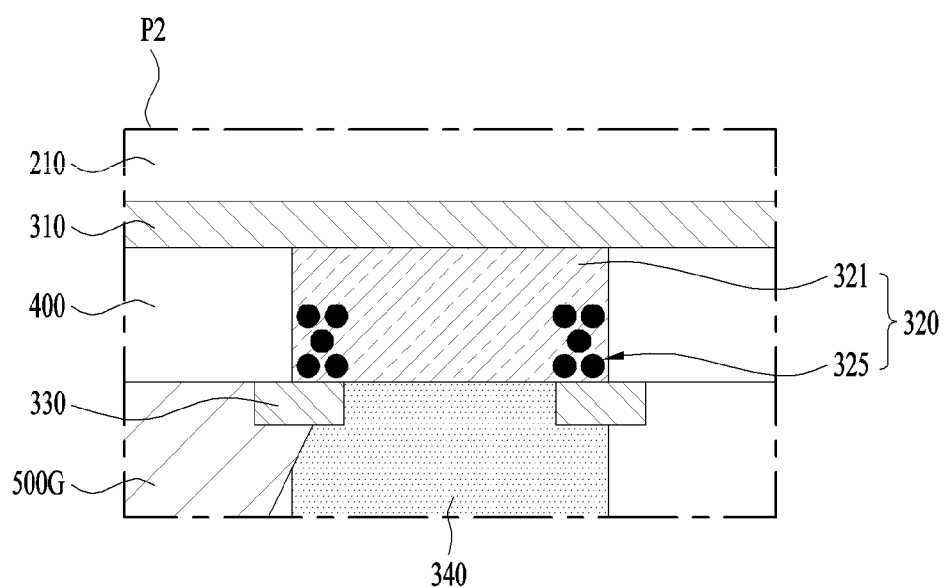
FIGS. 5A and 5B are enlarged views of region P2 in FIG. 4.
Figure 5B:
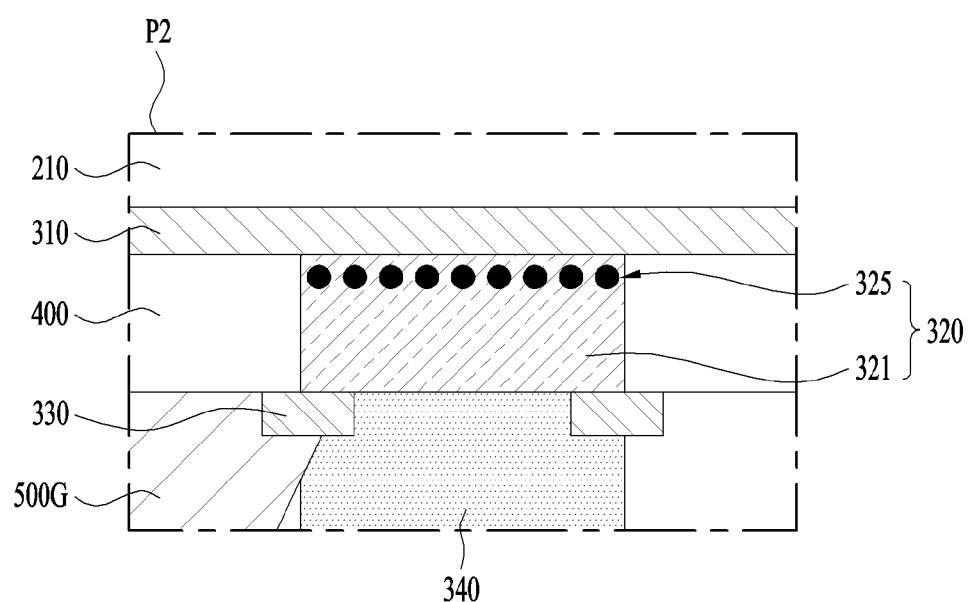

FIGS. 5A and 5B are enlarged views of region P2 in FIG. 4. Referring to FIGS. 4, 5A and 5B, in the display device according to another embodiment of the present invention, the changeable reflecting layer 320 of each changeable reflective structure 300 may include a dispersion solvent 321 and black charged particles 325 dispersed in the dispersion solvent 321. The black charged particles 325 may move toward the first changeable electrode 310 or the second changeable electrode 330 according to the voltage applied to the first changeable electrode 310 and the second changeable electrode 330. For example, the display device according to another embodiment of the present invention may apply a voltage having a polarity opposite to that of the black charged particles 325 to the second changeable electrode 330, so that the black charged particles 325 may gather around the second changeable electrode 330, as shown in FIG. 5A. For example, the display device according to another embodiment of the present invention may apply a voltage having a polarity opposite to that of the black charged particles 325 to the first changeable electrode 310, so that the black charged particles 325 may move around the first changeable electrode 310, as shown in FIG. 5B. Thus, the display device according to another embodiment of the present invention may change the transmissivity of the changeable reflecting layer 320 by the voltage applied to the first changeable electrode 310 and the second changeable electrode 330. In the display device according to another embodiment of the present invention, when the transmissivity of the changeable reflecting layer 320 is higher, the external light reflection due to the reflective pattern 340 may be increased. That is, in the display device according to another embodiment of the present invention, since the external light reflection due to the reflective pattern 340 is increased by moving the black charged particles 325 around the second changeable electrode 330, as shown in FIG. 5A, the reflectance of the reflecting area RA in the non-display state may be increased. Also, in the display device according to another embodiment of the present invention, since the black charged particles 325 is disposed close to the first changeable electrode 310, as shown in FIG. 5B, the reflecting area RA may serve as a black matrix in the display state. Therefore, in the display device according to another embodiment of the present invention, since the reflectance of the changeable reflective structure 300 is changed by adjusting the transmissivity of the changeable reflecting layer 320 depending on the state of the light-emitting structure 140B, 140R, 140G and 140W, so that the quality of the image in the display state and the mirror function in the non-display state may be effectively improved.

Figure 6:
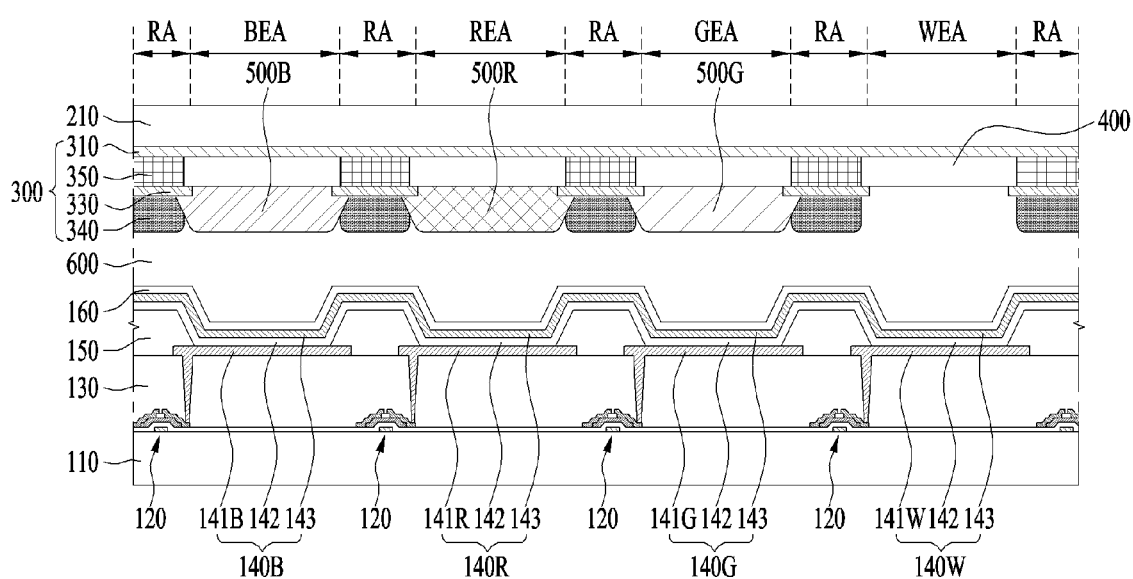
FIGS. 6 to 9 are views respectively showing various examples of a display device according to embodiments of the present invention.

The display device according to the embodiment of the present invention is described that the reflectance of the reflecting area RA is changed by the changeable reflecting layer 320 including a material having a polarity. However, in the display device according to another embodiment of the present invention, each of the changeable reflective structures 300 may include a changeable transmitting layer 350 having transmissivity changed by a voltage difference between the first changeable electrode 310 and the second changeable electrode 330, as shown in FIG. 6. For example, the changeable transmitting layer 350 may include a liquid crystal. In the display device according to another embodiment of the present invention, the second changeable electrode 330 may completely cover a lower surface of the changeable transmitting layer 350 facing the lower substrate 110. In the display device according to another embodiment of the present invention, each changeable reflective structure 300 may include a reflective pattern 340 on a lower surface of the second changeable electrode 330 facing the lower substrate 110. In the display device according to another embodiment of the present invention, the second changeable electrode 330 may be a transparent electrode. Thus, the display device according to another embodiment of the present invention may change the reflectance of the reflecting layer 320 using the voltage difference between the first changeable electrode 310 and the second changeable electrode 330, so that the quality of the image in the display state and the mirror function in the non-display state may be efficiently improved.

Figure 7:
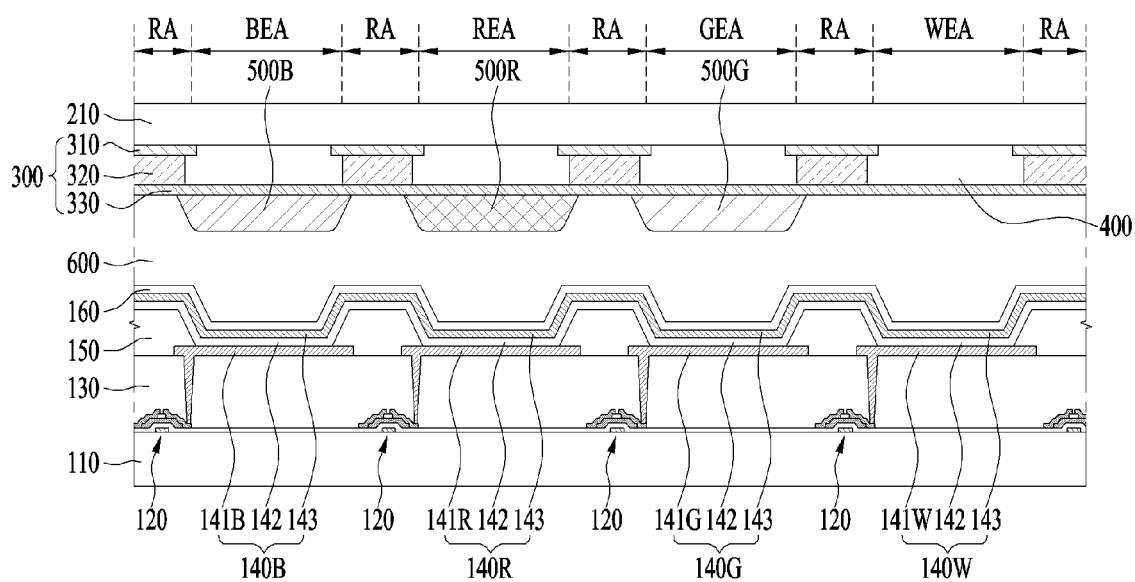

The display device according to the embodiment of the present invention is described that the first changeable electrode 310 between the upper substrate 210 and the changeable reflecting layer 320 is extended along a surface of the upper substrate 210. However, in the display device according to another embodiment of the present invention as described, the second changeable electrode 330 on a lower surface of the changeable reflecting layer 320 and a lower surface of the upper insulating pattern 400 which are faced the lower substrate 110 may be a common electrode, as shown in FIG. 7.

Figure 8:
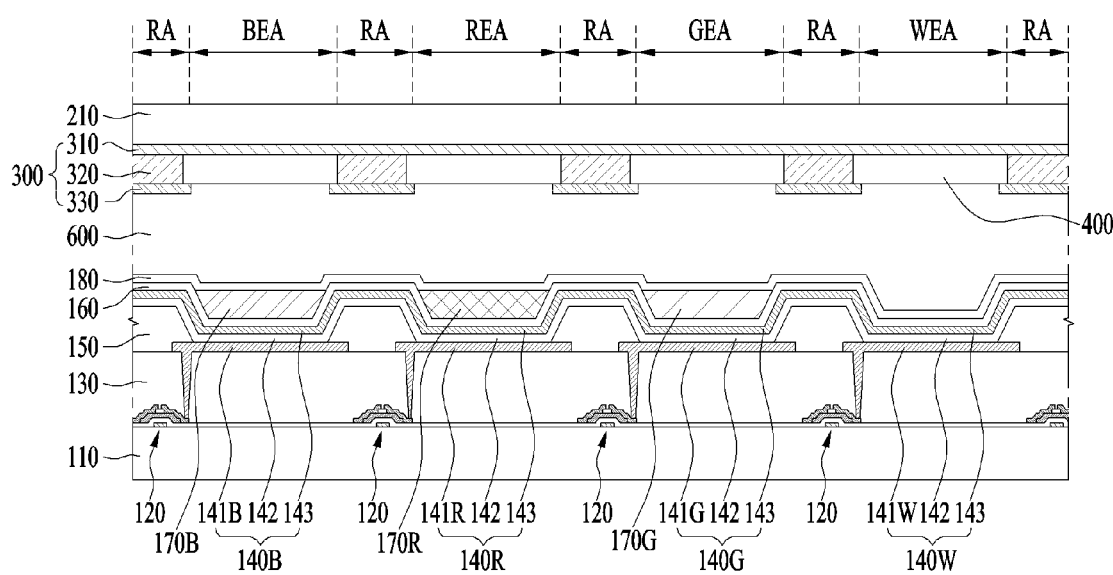

The display device according to the embodiment of the present invention is described that the color filters 500B, 500R and 500G are disposed on the upper insulating pattern 400. However, the display device according to the another embodiment of the present invention may include color filters 170B, 170R and 170G on the upper passivation layer 160, as shown in FIG. 8. In the display device according to another embodiment of the present invention, each of the color filters 170B, 170R and 170G may be disposed within the thickness difference due to the bank insulating layer 150. The display device according to another embodiment of the present invention may further include a device passivation layer 180 on the color filters 170B, 170R and 170G. The device passivation layer 180 may include an insulating material. For example, the device passivation layer 180 may include silicon oxide and/or silicon nitride. The device passivation layer 180 may have a multi-layer structure.

Figure 9:
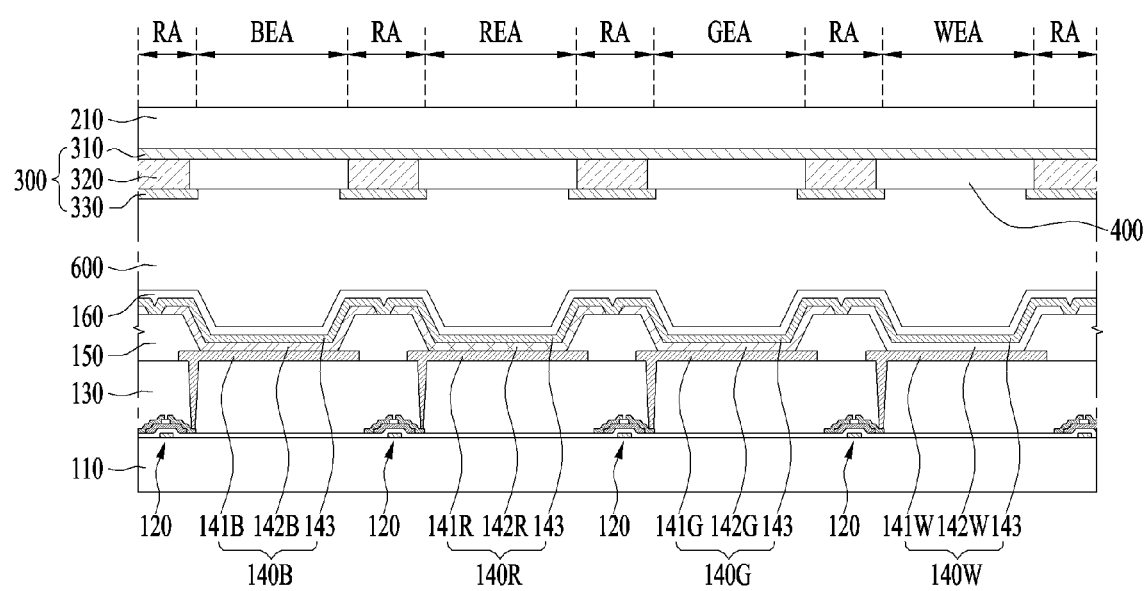

The display device according to the embodiment of the present invention is described that the light-emitting layers 142 of the light-emitting structures 140B, 140R, 140G and 140W are connected to each other. However, in the display device according to another embodiment of the present invention, each of the light-emitting structures 140B, 140R, 140G and 140W may include a separated light-emitting layer 142B, 14R, 142G and 142W, as shown in FIG. 9. For example, in the display device according to another embodiment of the present invention, the blue light-emitting structure 140B may include a blue light-emitting layer 142B, the red light-emitting structure 140R may include a red light-emitting layer 142R, the green light-emitting structure 140G may include a green light-emitting layer 142G, and the white light-emitting structure 140W may include a white light-emitting layer 142W.

In the result, the display device according to the embodiments of the present invention may control the reflectance of the reflecting area according to the state of the light-emitting structures. Thus, in the display device according to the embodiments of the present invention, the degradation of the color sense due to the external light reflected from the reflecting area may be prevented or reduced. Also, in the display device according to the embodiments of the present invention, the reflecting area may have sufficient reflectance in the non-display state. Therefore, in the display device according to the embodiments of the present invention, the quality of the image in the display state and the mirror function in the non-display state may be improved.

What is claimed is:

1. A display device comprising:
a lower substrate including emitting areas and reflecting areas;
an upper substrate opposite the lower substrate;
light-emitting structures on the emitting areas of the lower substrate; and
changeable reflective structures on the upper substrate, the changeable reflective structures overlapping with the reflecting areas of the lower substrate,
wherein each of at least two among the changeable reflective structures includes a first changeable electrode, a changeable transmitting layer, a second changeable electrode and a reflective pattern, which are sequentially stacked on the upper substrate,
wherein each of at least two among the reflective patterns is disposed between neighboring emitting areas of the lower substrate, so that the reflective patterns do not overlap with the emitting areas of the lower substrate in a cross-section view, and
wherein a transmissivity of the changeable transmitting layer is changed by a voltage difference between the first changeable electrode and the second changeable electrode.

2. The display device according to claim 1, wherein a lower surface of each changeable transmitting layer facing the lower substrate is completely covered by the corresponding second changeable electrode.

3. The display device according to claim 1, further comprising an upper insulating pattern surrounding the changeable transmitting layers,
wherein an edge of each second changeable electrode is disposed on the upper insulating pattern.

4. The display device according to claim 3, wherein the upper insulating pattern overlaps with the emitting areas of the lower substrate, and
wherein the upper insulating pattern includes a transparent material.

5. The display device according to claim 3, wherein a thickness of the upper insulating pattern is the same as a thickness of the changeable transmitting layers.

6. The device according to claim 5, wherein each of the first changeable electrodes is extended between the upper substrate and the upper insulating pattern.

7. The display device according to claim 3, further comprising color filters on the upper insulating pattern,
wherein each of at least two among color filters includes an edge overlapping with the corresponding second changeable electrode, and
wherein each of at least two among the reflective patterns is in contact with the corresponding second changeable electrode at an outside of the color filter.

8. The display device according to claim 7, wherein each of at least two among the color filters includes an end portion overlapping with the corresponding changeable reflective structure.

9. The display device according to claim 1, wherein a reflectance of the reflecting areas by the reflective patterns is larger than a reflectance of the reflecting areas by the changeable transmitting layers.

10. The display device according to claim 1, wherein each of the changeable transmitting layers includes a liquid crystal.

11. A display device comprising:
- a lower substrate and an upper substrate opposite the lower substrate;
- a lower light-emitting electrode on the lower substrate;
- a bank insulating layer covering an edge of the lower light-emitting electrode;
- a light-emitting layer on a surface of the lower light-emitting electrode exposed by the bank insulating layer;
- an upper light-emitting electrode on the light-emitting layer;
- a changeable reflecting layer on the upper substrate, the changeable reflecting layer overlapping with the bank insulating layer;
- a first changeable electrode between the upper substrate and the changeable reflecting layer;
- a reflective pattern between the bank insulating layer and the changeable reflecting layer; and
- a second changeable electrode between the changeable reflecting layer and the reflective pattern,
- wherein the second changeable electrode exposes a portion of the changeable reflecting layer overlapping with the reflective pattern.

12. The display device according to claim 11, further comprising an upper insulating pattern on the upper substrate, the upper insulating pattern contacting a side surface of the changeable reflecting layer,
wherein a thickness of the upper insulating pattern is the same as a thickness of the changeable reflecting layer.

13. The display device according to claim 12, further comprising a color filter on the upper insulating pattern,
wherein an edge of the color filter overlaps the second changeable electrode.

14. The display device according to claim 11, wherein the changeable reflecting layer includes an electro-phoresis device (EPD).

15. The display device according to claim 14, wherein the changeable reflecting layer includes a dispersion solvent and black charged particles.

16. The display device according to claim 11, wherein the reflective pattern is in direct contact with a portion of the changeable reflecting layer exposed by the second changeable electrode.

* * * * *